United States Patent
Calvetti et al.

(10) Patent No.: US 9,646,684 B1
(45) Date of Patent: May 9, 2017

(54) PCM MEMORY WITH MARGIN CURRENT ADDITION AND RELATED METHODS

(71) Applicant: STMICROELECTRONICS S.R.L., Agrate Brianza (IT)

(72) Inventors: Emanuela Calvetti, Villa d'Adda (IT); Marcella Carissimi, Treviolo (IT); Marco Pasotti, Travaco' Siccomario (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 15/225,898

(22) Filed: Aug. 2, 2016

(51) Int. Cl.
  *G11C 11/00* (2006.01)
  *G11C 13/00* (2006.01)
  *G11C 11/56* (2006.01)

(52) U.S. Cl.
  CPC ........ *G11C 13/0004* (2013.01); *G11C 13/004* (2013.01); *G11C 11/5678* (2013.01)

(58) Field of Classification Search
  CPC .............................................. G11C 11/5678
  USPC ........................................................ 365/163
  See application file for complete search history.

(56) References Cited

U.S. PATENT DOCUMENTS

| | | | |
|---|---|---|---|
| 8,264,872 B2 | 9/2012 | De Sandre et al. | |
| 9,286,160 B2 | 3/2016 | Manda et al. | |
| 9,324,399 B2 | 4/2016 | Pasotti et al. | |
| 2009/0080236 A1 | 3/2009 | Nakamura | |
| 2010/0054031 A1 | 3/2010 | De Sandre et al. | |
| 2010/0097833 A1* | 4/2010 | Kang ................. | G11C 13/0004 365/51 |
| 2015/0228338 A1 | 8/2015 | Manda et al. | |
| 2015/0235686 A1 | 8/2015 | Pasotti et al. | |

* cited by examiner

*Primary Examiner* — Hoai V Ho
(74) *Attorney, Agent, or Firm* — Slater Matsil, LLP

(57) ABSTRACT

A differential PCM memory may include first and second PCM elements, and a sense amplifier circuit configured to sense a difference between first and second sense currents passing through the first and second PCM elements, respectively, during a sense operation. The differential PCM memory may include a first margin current branch coupled in parallel with the first PCM element and configured to selectively add a first margin current to the first sense current, and a second margin current branch coupled in parallel with the second PCM element and configured to selectively add a second margin current to the second sense current.

21 Claims, 5 Drawing Sheets

PCM MEMORY WITH MARGIN CURRENT ADDITION AND RELATED METHODS

TECHNICAL FIELD

The present disclosure relates to the field of memories, and, more particularly, to phase change memories and related methods.

BACKGROUND

Solid-state memory devices have become quite popular due to several advantages over typical active memory devices. First and foremost, the solid-state memory device comprises no moving parts, so it consumes less power and provides robust reliability. Moreover, solid-state memory devices are resistant to mechanical stress, such as impacts and vibration.

One type of memory used for solid-state memory devices is the flash memory device. The flash memory device may be based upon NAND or NOR logic gates, for example. For example, U.S. Patent Application Publication No. 2009/0080236 to Nakamura discloses a memory device. The memory device comprises a plurality of memory cells, and bit lines coupled to each memory cell. The memory device provides a supply voltage to each of the memory cells via the bit lines.

Another approach to solid-state memory is a phase-change memory. These devices, rather than using the floating gate approach of flash memory, use chalcogenide glass for storing data. In particular, chalcogenide glass may be forced to take either amorphous or crystalline form by exposing it to a prescribed level of heat. The current state is detected by detecting the resistivity of the chalcogenide glass, which predictably varies based upon the form thereof.

SUMMARY

Generally speaking, a differential phase change material (PCM) memory may include first and second PCM elements, and a sense amplifier circuit configured to sense a difference between first and second sense currents passing through the first and second PCM elements, respectively, during a sense operation. The differential PCM memory may include a first margin current branch coupled in parallel with the first PCM element and configured to selectively add a first margin current to the first sense current, and a second margin current branch coupled in parallel with the second PCM element and configured to selectively add a second margin current to the second sense current.

More specifically, each of the first and second margin current branches may comprise a control switch coupled to the sense amplifier circuit and configured to control flow of the first and second margin currents. The control switch of the first margin current branch may be configured to perform a logic check operation on the first PCM element by adding the first margin current to the first sense current during the sense operation. The control switch of the second margin current branch may be configured to perform a logic check operation on the second PCM element by adding the second margin current to the second sense current during the sense operation.

In some embodiments, the differential PCM memory may further comprise a controller configured to flag the first and second PCM elements with an error value when the sense operation has a different output value when the first and second margin currents are added. Each of the first and second margin current branches may comprise a plurality of current sources. Each of the first and second margin current branches may be configured to generate different margin currents.

Additionally, the sense amplifier circuit may comprise a first stage current integrator circuit coupled to the first and second PCM elements, and a second stage comparator circuit coupled downstream from the first stage current integrator circuit. The sense amplifier circuit may comprise a third stage latch circuit coupled downstream from the second stage comparator circuit and configured to output an output signal based upon the difference between the first and second sense currents.

Another aspect is directed to a method for making a differential PCM memory. The method may include forming first and second PCM elements, and forming a sense amplifier circuit configured to sense a difference between first and second sense currents passing through the first and second PCM elements, respectively, during a sense operation. The method may include forming a first margin current branch coupled in parallel with the first PCM element and configured to selectively add a first margin current to the first sense current, and forming a second margin current branch coupled in parallel with the second PCM element and configured to selectively add a second margin current to the second sense current.

Another aspect is directed to a method for checking and refreshing a differential PCM memory. The differential PCM memory may include first and second PCM elements, a sense amplifier circuit configured to sense a difference between first and second sense currents passing through the first and second PCM elements, respectively, during a sense operation, a first margin current branch coupled in parallel with the first PCM element, and a second margin current branch coupled in parallel with the second PCM element. The method may include during the sense operation, using the first margin current branch to selectively add a first margin current to the first sense current, and during the sense operation, using the second margin current branch to selectively add a second margin current to the second sense current.

DETAILED DESCRIPTION

Figure 1:
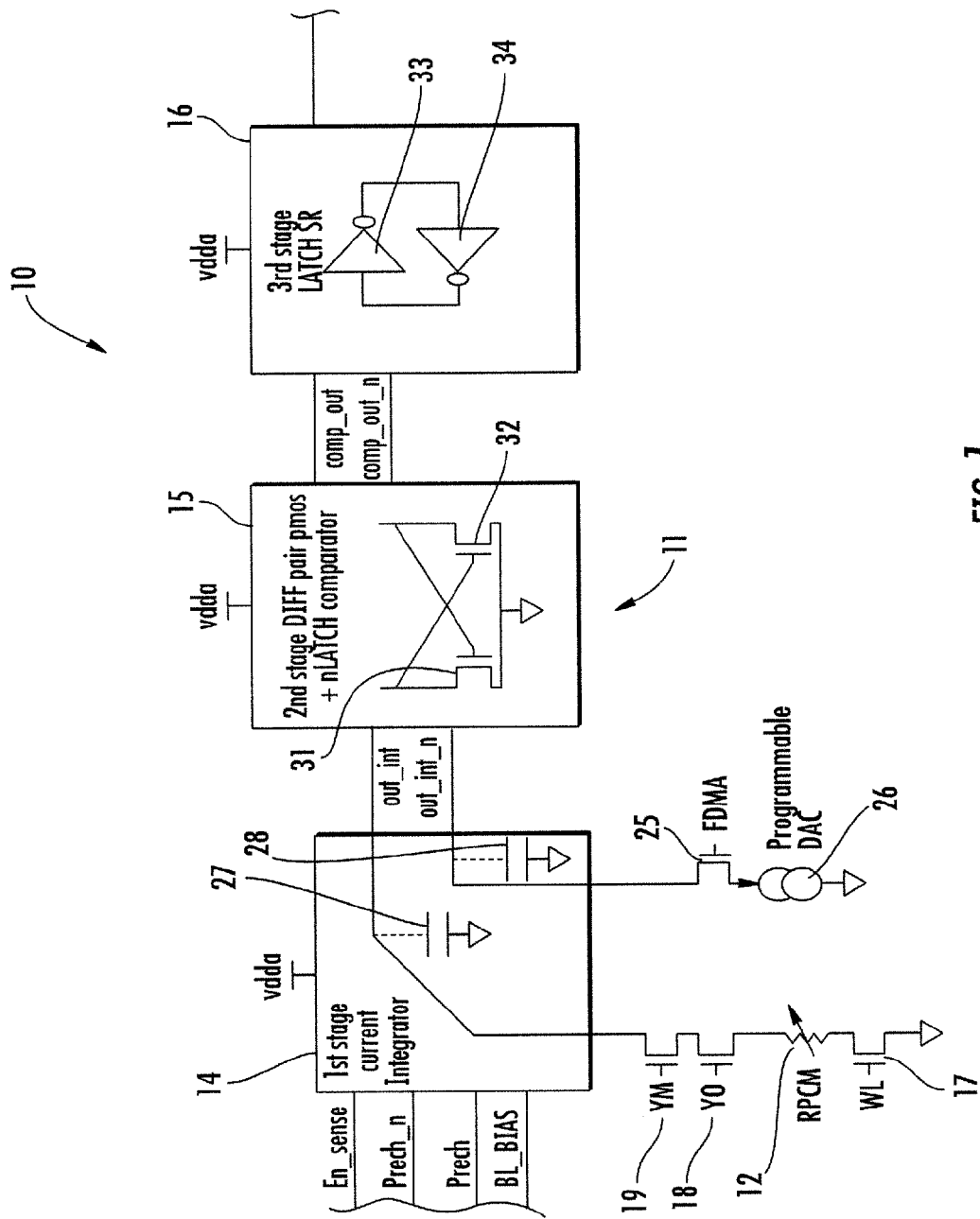
FIG. 1 is a schematic diagram of a PCM memory, according to the present disclosure.

The present disclosure will now be described more fully hereinafter with reference to the accompanying drawings, in which several embodiments of the present disclosure are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and base 100 reference numerals are used to indicate similar elements in alternative embodiments.

Referring to FIG. 1, an approach to a PCM memory 10 is now described. The PCM memory 10 illustratively includes a PCM element branch comprising a PCM element 12, a write line transistor (e.g. the illustrated metal-oxide-semiconductor field-effect transistor (MOSFET), a bipolar junction transistor (BJT), or a junction gate field-effect transistor (JFET)) 17 coupled to a first end of the PCM element, and first and second read transistors (e.g. the illustrated MOSFET, a BJT, or a JFET) 18-19 coupled to a second end of the PCM element. The PCM memory 10 illustratively includes a reference branch comprising a settable current source (e.g. the illustrated programmable digital-to-analog converter) 26, and a reference transistor (e.g. the illustrated MOSFET, a BJT, or a JFET) 25 coupled to the settable current source.

The PCM memory 10 illustratively includes a sense amplifier circuit 11 configured to sense a difference during a sense operation between a sense current passing through the PCM element 12 and a reference current from the settable current source 26. The sense amplifier circuit 11 illustratively includes a first stage current integrator circuit 14 coupled to the PCM element branch and the reference branch. The first stage current integrator circuit 14 illustratively includes first and second extracted capacitances 27-28 respectively coupled to the PCM element branch and the reference branch.

The sense amplifier circuit 11 illustratively includes a second stage comparator circuit 15 coupled downstream from the first stage current integrator circuit 14. The second stage comparator circuit 15 illustratively includes first and second transistors (e.g. the illustrated MOSFET, a BJT, or a JFET) 31-32. The sense amplifier circuit 11 illustratively includes a third stage latch circuit 16 coupled downstream from the second stage comparator circuit 15 and configured to output an output signal based upon the difference between the sense current and the reference current. The third stage latch circuit 16 illustratively includes a simple reset (SR) latch circuit having cross-coupled first and second inverters 33-34, but other latch configurations could be used.

The PCM memory 10 may have some potential drawbacks. For example, the PCM memory 10 is single ended, and the PCM element 12 may suffer current drift as time passes, thereby reducing the differential between the sensed current and the reference current, which can provide erroneous readout and increase access time. Hence, there is a need to improve the reliability of the PCM memory 10 as time passes and to address degradation in the PCM element 12.

Figure 2:
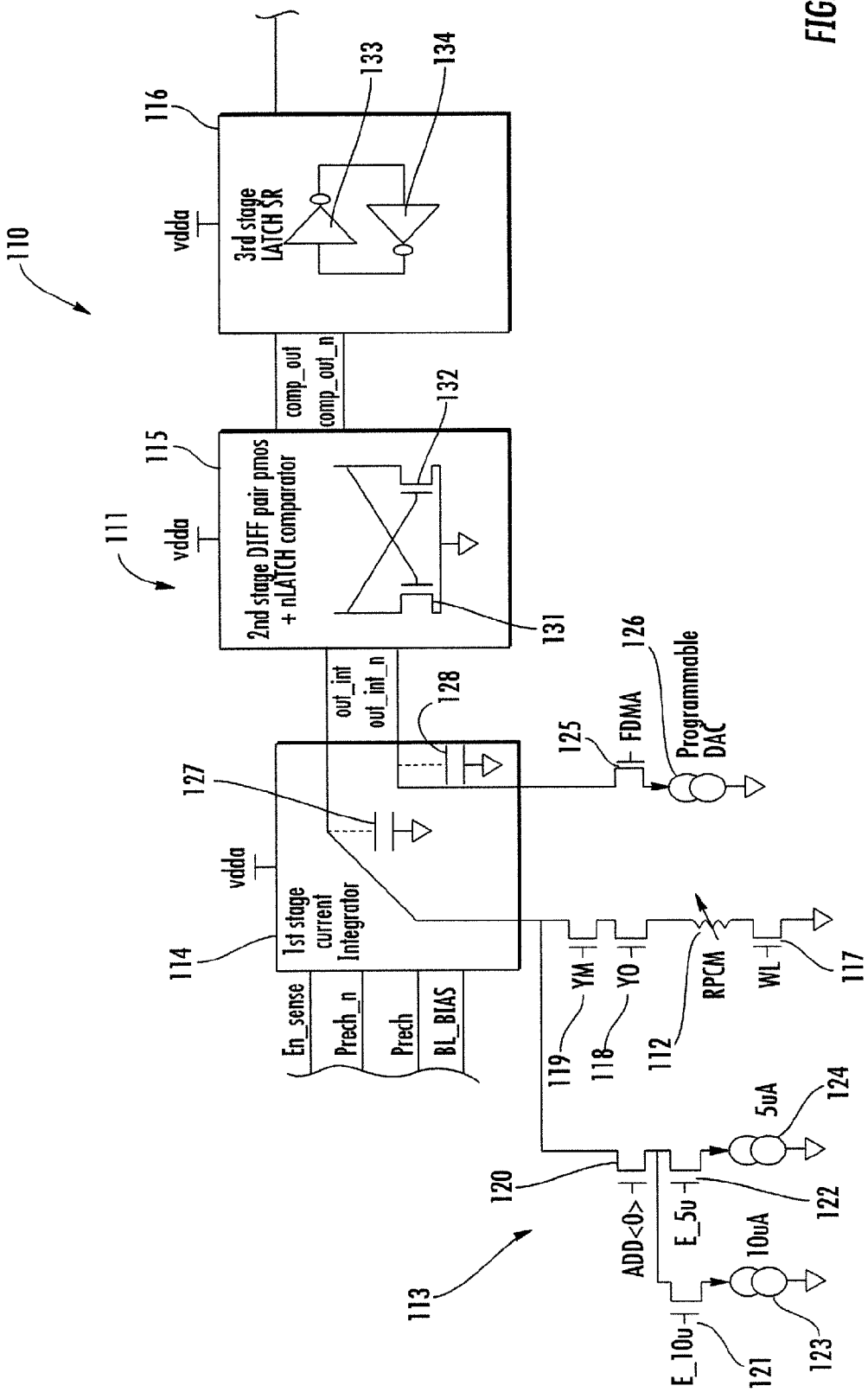
FIG. 2 is a schematic diagram of another embodiment of the PCM memory, according to the present disclosure.

Referring now additionally to FIG. 2, another embodiment of the PCM memory 110 is now described. In this embodiment of the PCM memory 110, those elements already discussed above with respect to FIG. 1 are incremented by 100 and most require no further discussion herein. This embodiment differs from the previous embodiment in that this PCM memory 110 illustratively includes a margin current branch 113 coupled in parallel with the PCM element 112 and configured to selectively add a margin current to the sense current.

More specifically, the margin current branch 113 illustratively includes a control switch (e.g. the illustrated MOSFET, a BJT, or a JFET) 120 coupled to the sense amplifier circuit 111 and configured to control flow of the margin current. The control switch 120 is configured to perform a logic check operation on the PCM element 112 by adding the margin current to the sense current during the sense operation.

The margin current branch 113 illustratively includes a plurality of current sources 123-124, and a plurality of sub-control switches (e.g. the illustrated MOSFET, a BJT, or a JFET) 121-122 respectively coupled to the plurality of current sources. Via selective control of the plurality of sub-control switches 121-122, the margin current may be selectively varied via current addition, i.e. to generate different margin currents (e.g. the illustrated 5 µA, 10 µA, and 15 µA) for addition to the sense current.

Helpfully, the PCM memory 110 may detect degradation in the PCM element 112 if the detected data value changes when adding the margin current. This embodiment of the PCM memory 110 may provide an approach to detecting degradation in the PCM element 112. This may provide for a more reliable PCM memory 110 and faster access times.

Another aspect is directed to a method for making a PCM memory 110. A method according to the aspect includes forming a PCM element 112, and forming a sense amplifier circuit 111 configured to sense a difference during a sense operation between a sense current passing through the PCM element and a reference current. A method according to the aspect includes forming a margin current branch 113 coupled in parallel with the PCM element 112 and configured to selectively add a margin current to the sense current.

Another aspect is directed to a method for checking and refreshing a PCM memory 110. The PCM memory 110 includes a PCM element 112, a sense amplifier circuit 111 configured to sense a difference during a sense operation between a sense current passing through the PCM element and a reference current, and a margin current branch 113 coupled in parallel with the PCM element. A method according to the aspect comprises during the sense operation, using the margin current branch 113 to selectively add a margin current to the sense current.

Figure 3:
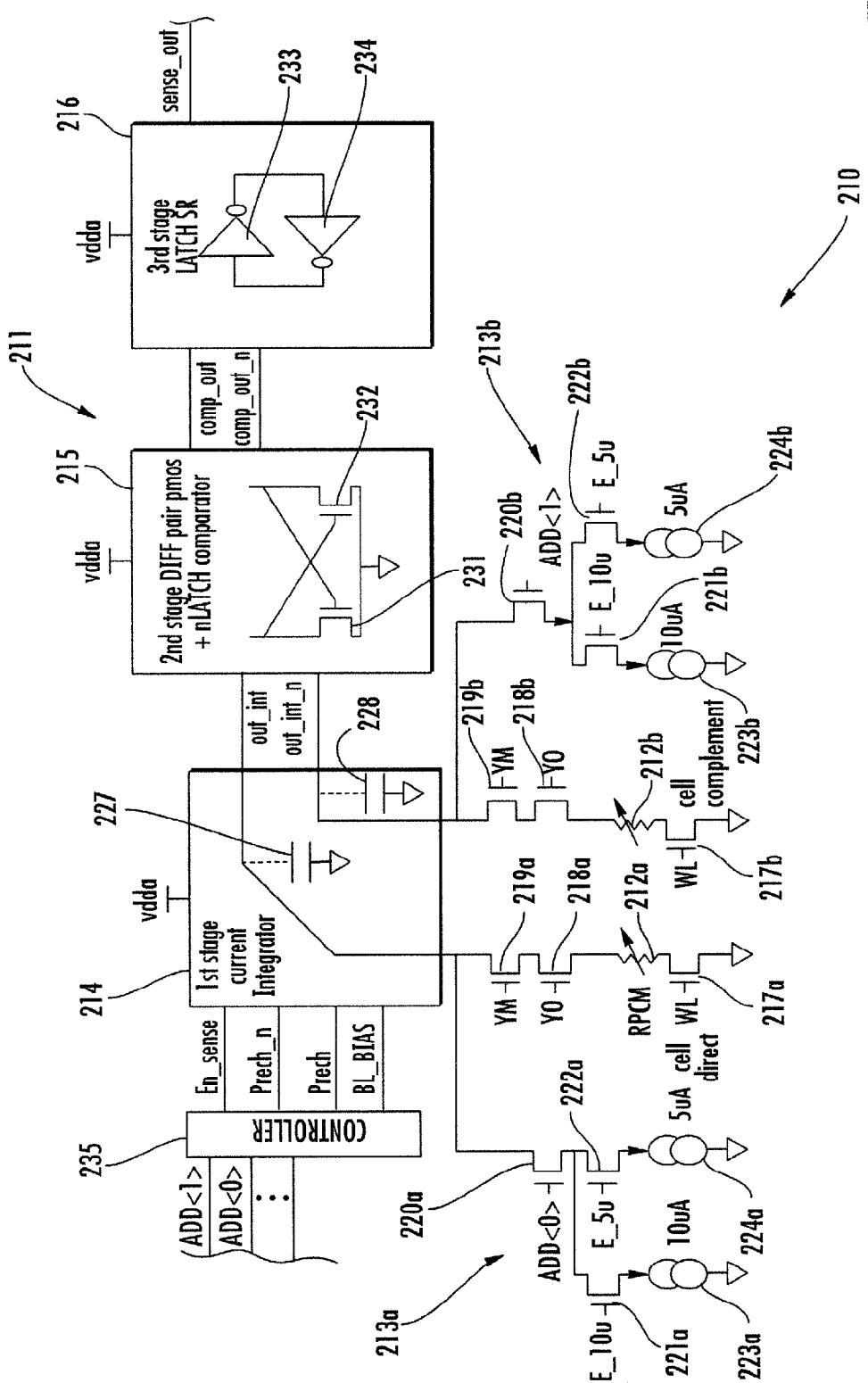
FIG. 3 is a schematic diagram of a differential PCM memory, according to the present disclosure.
Figure 4:
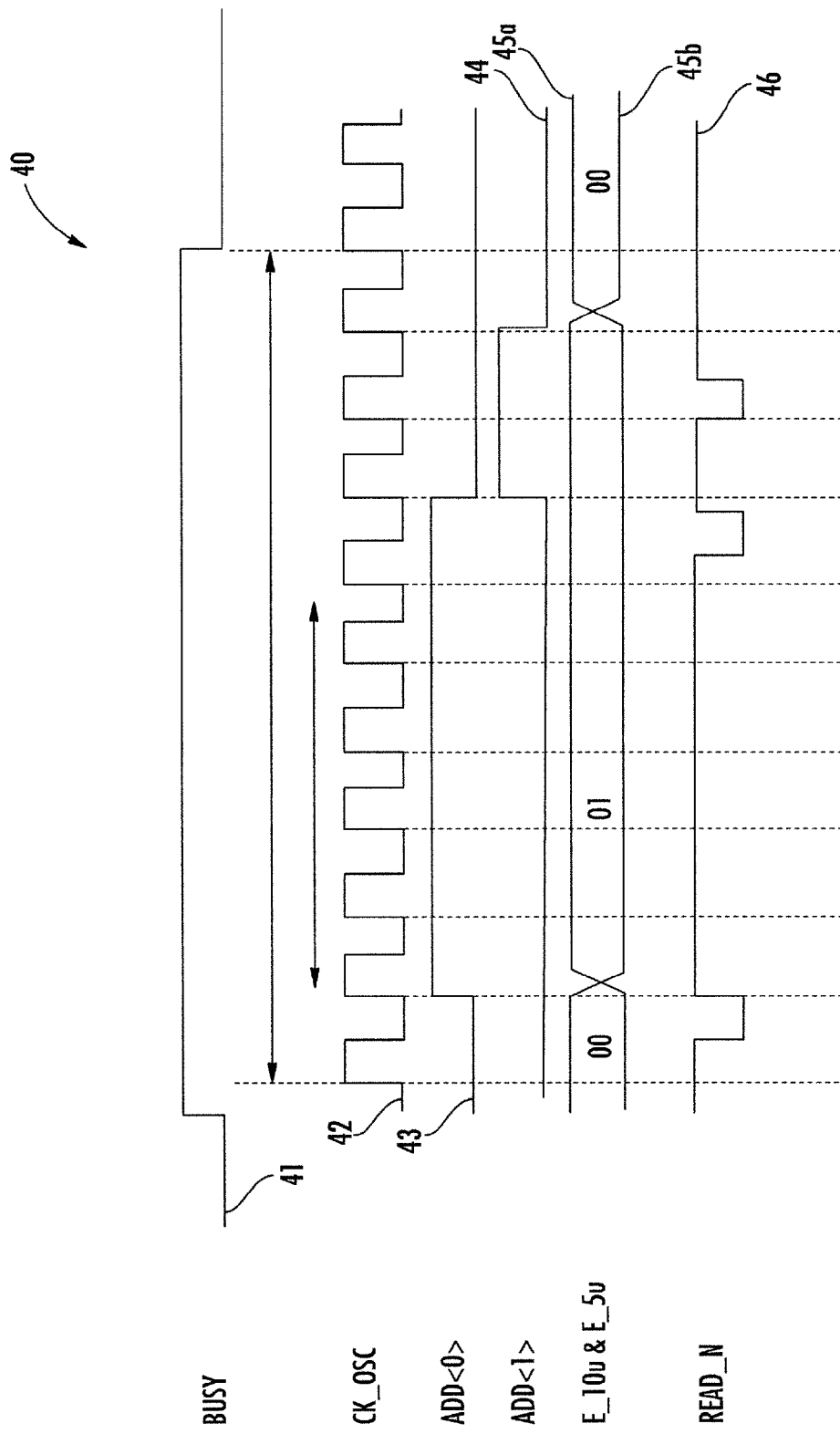
FIG. 4 is a timing diagram for the differential PCM memory of FIG. 3.
Figure 5:
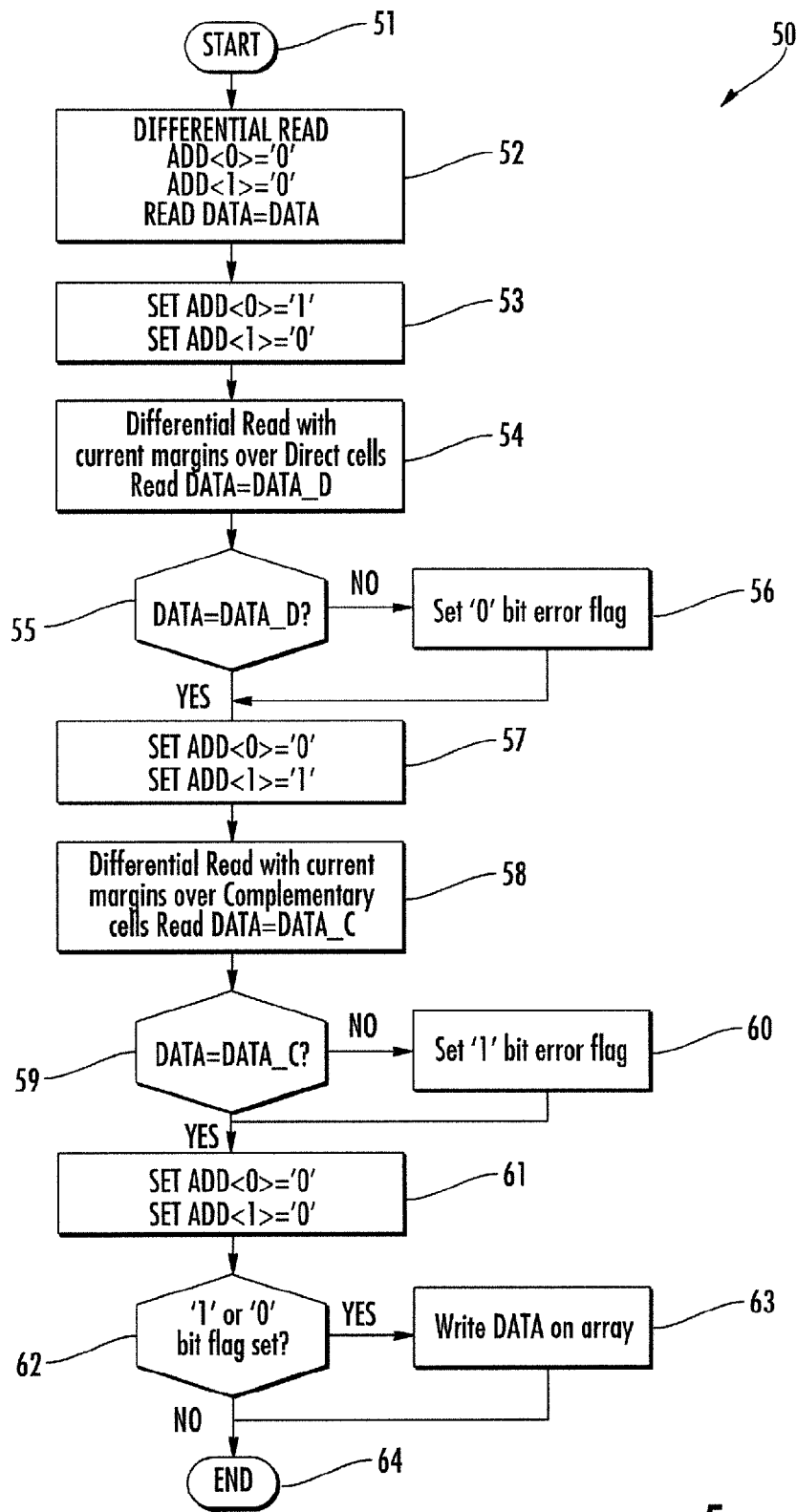
FIG. 5 is a flowchart for operation of the differential PCM memory of FIG. 3.

Referring now additionally to FIGS. 3-5, another embodiment of the PCM memory 210 is now described. In this embodiment of the PCM memory 210, those elements already discussed above with respect to FIGS. 1-2 are incremented by 200 and most require no further discussion herein. This embodiment differs from the previous embodiment in that this PCM memory 210 is a differential PCM memory (i.e. having first/direct and second/complementary memory elements). The differential PCM memory 210 illustratively comprises first and second PCM elements 212a-212b (i.e. the direct read and complementary read PCM cells), and a sense amplifier circuit 211 configured to sense a difference between first and second sense currents passing through the first and second PCM elements, respectively, during a sense operation. The differential PCM memory 210 illustratively includes a first margin current branch 213a coupled in parallel with the first PCM element 212a and configured to selectively add a first margin current to the first sense current, and a second margin current branch 213b coupled in parallel with the second PCM element 212b and configured to selectively add a second margin current to the second sense current.

More specifically, each of the first and second margin current branches 213a-213b comprises a control switch 220a-220b coupled to the sense amplifier circuit 211 and configured to control flow of the first and second margin currents. The control switch 220a of the first margin current branch 213a is configured to perform a logic check operation on the first PCM element 212a by adding the first margin current to the first sense current during the sense operation. The control switch 220b of the second margin current branch 213b is configured to perform a logic check operation on the second PCM element 212b by adding the second margin current to the second sense current during the sense operation. In the illustrated embodiment, the differential PCM memory 210 further comprises a controller 235 configured to flag the first and second PCM elements 212a-212b with an error value (e.g. an error bit value) when the sense operation has a different output value when the first and second margin currents are added.

Another aspect is directed to a method for making a differential PCM memory 210. A method according to the aspect includes forming first and second PCM elements 212a-212b, and forming a sense amplifier circuit 211 configured to sense a difference between first and second sense currents passing through the first and second PCM elements, respectively, during a sense operation. A method according to the aspect includes forming a first margin current branch 213a coupled in parallel with the first PCM element 212a and configured to selectively add a first margin current to the first sense current, and forming a second margin current 213b branch coupled in parallel with the second PCM element 212b and configured to selectively add a second margin current to the second sense current.

Another aspect is directed to a method for checking and refreshing a differential PCM memory 210. The differential PCM memory 210 includes first and second PCM elements 212a-212b, a sense amplifier circuit 211 configured to sense a difference between first and second sense currents passing through the first and second PCM elements, respectively, during a sense operation, a first margin current branch 213a coupled in parallel with the first PCM element, and a second margin current branch 213b coupled in parallel with the second PCM element. A method according to the aspect includes during the sense operation, using the first margin current branch 213a to selectively add a first margin current to the first sense current, and during the sense operation, using the second margin current branch 213b to selectively add a second margin current to the second sense current.

Referring now to FIG. 4, a timing diagram 40 is now described. The timing diagram 40 shows a busy signal 41, a clock signal 42, an ADD<0> signal 43 configured to activate the control switch 220a of the first margin current branch 213a, an ADD<1> signal 44 configured to activate the control switch 220b of the second margin current branch 213b, an E_10u signal 45a configured to activate the sub-control switch 221a of the first and second margin current branches 213a-213b, an E_5u signal 45b configured to activate the sub-control switch 221b of the first and second margin current branches 213a-213b, and a READ_N signal 46.

Referring now to FIG. 5, a flowchart 50 and a method for checking and refreshing the differential PCM memory 210 is now described. (Block 51). At Block 52, the control switches 220a-220b are opened and a normal differential read operation is performed. At Blocks 53-55, the first margin current is added to the first sense current of the first PCM element 212a and a differential read operation is performed (i.e. performing a logic check on a "0" bit). If the read data from this differential read operation differs from that of the normal differential read operation, the error flag for the direct cell 212a is set at Block 56.

At Blocks 57-59, the second margin current is added to the second sense current of the second PCM element 212b and a differential read operation is performed (i.e. performing a logic check on a "1" bit). If the read data from this differential read operation differs from that of the normal differential read operation, the error flag for the complementary cell 212b is set at Block 60. In other words, the method may include three separate differential read operations (i.e. a normal read, and two margin current addition reads). At Blocks 61-64, the control switches 220a-220b are opened, and if any error flag is set, the data is rewritten to the first and second PCM elements 212a-212b. In some embodiments, the controller 235 is configured to store each memory word with a command bit for activating the above described memory check and refresh method.

The above described memory check and refresh method may use only three memory read accesses, which provides a fast memory check without introducing significant latency. A method according to the aspect also provides for reduced access time to the PCM memories 110, 210 due to the greater read margins (i.e. a greater differential at inputs leads to the comparators providing output faster).

Also, the disclosed method can check data content robustness in specific moment and can refresh content in case of reduced cells current margins. This provides an approach to issues with differential PCM memories, where the direct and complementary cells have a specific behavior (i.e. cells drift together, and the absolute current value not being relevant as in other floating gate technologies). It is described: A phase change material (PCM) memory comprising: a PCM element; a sense amplifier circuit configured to sense a difference during a sense operation between a sense current passing through the PCM element and a reference current; and a margin current branch coupled in parallel with the PCM element and configured to selectively add a margin current to the sense current.

The margin current branch may comprise a control switch coupled to the sense amplifier circuit and configured to control flow of the margin current.

The control switch may be configured to perform a logic check operation on the PCM element by adding the margin current to the sense current during the sense operation.

The PCM memory may comprise a controller configured to flag the PCM element with an error value when the sense operation has a different output value when the margin current is added.

The margin current branch may comprise a plurality of current sources.

The margin current branch may be configured to generate different margin currents.

A method for making a phase change material (PCM) memory, the method comprising: forming a PCM element; forming a sense amplifier circuit configured to sense a difference during a sense operation between a sense current passing through the PCM element and a reference current; and forming a margin current branch coupled in parallel with the PCM element and configured to selectively add a margin current to the sense current.

The margin current branch may comprise a control switch coupled to the sense amplifier circuit and configured to control flow of the margin current.

The control switch may be configured to perform a logic check operation on the PCM element by adding the margin current to the sense current during the sense operation.

The PCM element may be flagged with an error value when the sense operation has a different output value when the margin current is added.

The margin current branch may comprise a plurality of current sources.

A method for checking and refreshing a phase change material (PCM) memory comprising a PCM element, a sense amplifier circuit configured to sense a difference during a sense operation between a sense current passing through the PCM element and a reference current, and a margin current branch coupled in parallel with the PCM element, the method comprising: during the sense operation, using the margin current branch to selectively add a margin current to the sense current.

The margin current branch may comprise a control switch coupled to the sense amplifier circuit and configured to control flow of the margin current.

The control switch may be configured to perform a logic check operation on the PCM element by adding the margin current to the sense current during the sense operation.

The method may further comprise flagging the PCM element with an error value when the sense operation has a different output value when the margin current is added.

The margin current branch may comprises a plurality of current sources. While this detailed description has set forth some embodiments of the present invention, the appended claims cover other embodiments of the present disclosure which differ from the described embodiments according to various modifications and improvements. For example, the herein described PCM memories could be applied within an array of such memory devices.

Than which is claimed is:

1. A differential phase change material (PCM) memory comprising:
    first and second PCM elements;
    a sense amplifier circuit configured to sense a difference between first and second sense currents passing through said first and second PCM elements, respectively, during a sense operation;
    a first margin current branch coupled in parallel with said first PCM element and configured to selectively add a first margin current to the first sense current; and
    a second margin current branch coupled in parallel with said second PCM element and configured to selectively add a second margin current to the second sense current.

2. The differential PCM memory of claim 1 wherein each of said first and second margin current branches comprises a control switch coupled to said sense amplifier circuit and configured to control flow of the first and second margin currents.

3. The differential PCM memory of claim 2 wherein said control switch of said first margin current branch is configured to perform a logic check operation on said first PCM element by adding the first margin current to the first sense current during the sense operation.

4. The differential PCM memory of claim 2 wherein said control switch of said second margin current branch is configured to perform a logic check operation on said second PCM element by adding the second margin current to the second sense current during the sense operation.

5. The differential PCM memory of claim 1 further comprising a controller configured to flag said first and second PCM elements with an error value when the sense operation has a different output value when the first and second margin currents are added.

6. The differential PCM memory of claim 1 wherein each of said first and second margin current branches comprises a plurality of current sources.

7. The differential PCM memory of claim 1 wherein each of said first and second margin current branches is configured to generate different margin currents.

8. The differential PCM memory of claim 1 wherein said sense amplifier circuit comprises a first stage current integrator circuit coupled to said first and second PCM elements, and a second stage comparator circuit coupled downstream from said first stage current integrator circuit.

9. The differential PCM memory of claim 8 wherein said sense amplifier circuit comprises a third stage latch circuit coupled downstream from said second stage comparator circuit and configured to output an output signal based upon the difference between the first and second sense currents.

10. A method for making a differential phase change material (PCM) memory, the method comprising:
    forming first and second PCM elements;
    forming a sense amplifier circuit configured to sense a difference between first and second sense currents passing through the first and second PCM elements, respectively, during a sense operation;
    forming a first margin current branch coupled in parallel with the first PCM element and configured to selectively add a first margin current to the first sense current; and
    forming a second margin current branch coupled in parallel with the second PCM element and configured to selectively add a second margin current to the second sense current.

11. The method of claim 10 wherein each of the first and second margin current branches comprises a control switch coupled to the sense amplifier circuit and configured to control flow of the first and second margin currents.

12. The method of claim 11 wherein the control switch of the first margin current branch is configured to perform a logic check operation on the first PCM element by adding the first margin current to the first sense current during the sense operation.

13. The method of claim 11 wherein the control switch of the second margin current branch is configured to perform a logic check operation on the second PCM element by adding the second margin current to the second sense current during the sense operation.

14. The method of claim 10 wherein the first and second PCM elements are flagged with an error value when the sense operation has a different output value when the first and second margin current are added.

15. The method of claim 10 wherein each of the first and second margin current branches comprises a plurality of current sources.

16. A method for checking and refreshing a differential phase change material (PCM) memory comprising first and second PCM elements, a sense amplifier circuit configured to sense a difference between first and second sense currents passing through the first and second PCM elements, respectively, during a sense operation, a first margin current branch coupled in parallel with the first PCM element, and a second margin current branch coupled in parallel with the second PCM element, the method comprising:
    during the sense operation, using the first margin current branch to selectively add a first margin current to the first sense current; and
    during the sense operation, using the second margin current branch to selectively add a second margin current to the second sense current.

17. The method of claim 16 wherein each of the first and second margin current branches comprises a control switch coupled to the sense amplifier circuit and configured to control flow of the first and second margin currents.

18. The method of claim 17 wherein the control switch of the first margin current branch is configured to perform a logic check operation on the first PCM element by adding the first margin current to the first sense current during the sense operation.

19. The method of claim 17 wherein the control switch of the second margin current branch is configured to perform a logic check operation on the second PCM element by adding the second margin current to the second sense current during the sense operation.

20. The method of claim 16 further comprising flagging the first and second PCM elements with an error value when the sense operation has a different output value when the first and second margin current are added.

21. The method of claim 16 wherein each of the first and second margin current branches comprises a plurality of current sources.

* * * * *